United States Patent [19]

Mitchell et al.

[11] Patent Number: 4,501,637
[45] Date of Patent: Feb. 26, 1985

[54] LED HAVING SELF-ALIGNED LENS

[75] Inventors: Curtis W. Mitchell, Phoenix; Howard M. Berg, Scottsdale, both of Ariz.

[73] Assignee: Motorola, Inc., Schaumburg, Ill.

[21] Appl. No.: 573,999

[22] Filed: Jan. 26, 1984

Related U.S. Application Data

[62] Division of Ser. No. 272,822, Jun. 12, 1981.

[51] Int. Cl.³ .................. B44C 1/22; C03C 15/00; C03C 25/06; B29C 17/08
[52] U.S. Cl. ........................ 156/630; 29/569 L; 156/633; 156/644; 156/655; 156/668
[58] Field of Search .............. 357/17, 19; 29/569 L; 350/96.20, 417; 156/629, 630, 633, 644, 655, 656, 659.1, 668

[56] References Cited

U.S. PATENT DOCUMENTS 4,307,935  12/1981  Monnier .................... 350/96.20

FOREIGN PATENT DOCUMENTS 56-46574  4/1981  Japan ........................ 357/19

Primary Examiner—William A. Powell
Attorney, Agent, or Firm—Paul F. Wille

[57] ABSTRACT

A relatively thick ring of polymer or metal encircles the emitting area of a light emitting diode. A spherical lens rests on the ring and is both accurately located with respect to and spaced from the emitting area.

3 Claims, 4 Drawing Figures

- PRIOR ART -

LED HAVING SELF-ALIGNED LENS

This is a division of application Ser. No. 272,822, filed June 12, 1981.

BACKGROUND OF THE INVENTION

This invention relates to electro-optical devices having a photo-active area such as light emitting diodes (LEDs) and photodetectors and, in particular, to LEDs and photodetectors having an integral lens. As used herein, "light" refers to electromagnetic radiation which semiconductor material can be caused to emit or detect, whether or not such emission is visible to the unaided human eye.

A number of LED devices have been proposed in the prior art in which a lens is attached or located adjacent the light emitting area of the diode. Since the lens has an approximate focal zone, it is important that the lens be accurately located so that the focal zone coincides with the emitting area of the diode. This entails a careful positioning of the lens in three dimensions. In the past, the emitting area is coated and a lens is rested on the liquid coating. The lens is then moved about while the LED is turned on in order to find the optimum position. This approach is tedious, time consuming, and costly. Further, since even slight lateral displacement (parallel to the plane of the emitting area) causes large changes in the amount of light coupled, performance specifications of the LED are difficult to achieve consistently. A smaller, but not insignificant, variation is caused by variation from device to device in thickness of the coating. An alternative procedure is to align the lens visually over the device's emission area.

It is, therefore, an object of the present invention to provide an LED having a lens accurately located in three dimensions with respect to the emitting area of the diode.

Another oject of the present invention is to provide an easily assembled LED having a lens.

A further object of the present invention is to provide an improved method for manufacturing LED's with lenses.

Another object of the present invention is to provide an improved LED structure so that lenses can be attached prior to the diodes being separated from the wafer.

SUMMARY OF THE INVENTION

The foregoing objects are achieved in the present invention wherein a ring of material is formed surrounding the emitting area of the LED. Controlling the thickness and aperture of the ring provides an accurate spacing between the lens and the emitting area. The aperture in the ring also laterally locates the lens. The ring is formed by coating the LED and patterning the coating to leave a ring about the active area. The coating may comprise diverse materials such as metal and/or polymers such as photoresist and polyimides.

A more complete understanding of the present invention can be obtained by considering the following detailed description in conjunction with the accompanying drawings, in which:

DETAILED DESCRIPTION OF THE INVENTION

Figure 1:
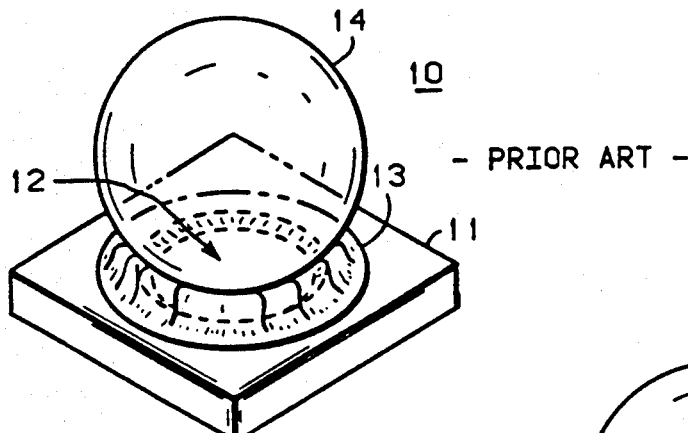
FIG. 1 illustrates an LED with lens in accordance with the prior art.

In accordance with the prior art, as illustrated in FIG. 1, a semiconductor body 11 comprises a photo-emitting area 12. Semiconductor body 11 may comprise any suitable material such as gallium arsenide or, more particularly, what is known in the art as a heterojunction device comprising several doped layers of gallium arsenide. As known in the art, the flow of electric current through the junction in these devices causes the "active" layer to emit photons, the energy of which is within a relatively narrow band of frequencies, giving the LED its characteristic color. The electrical leads and connections by which current is caused to flow through the junction have been omitted for clarity.

Since the emission of photons by emitting area 12 is characterized by what is known as Lambertian emission, it is desired to gather as much of the emitted light as possible and redirect it into a preferred direction. To do this a spherical lens 14 is positioned over emitting area 12 and held in place by a suitable adhesive 13. As with any lens, it is extremely important that the photo-emitting area be within the focal zone of the lens. This requires that the lens be accurately positioned with respect to emitting area 12. As illustrated in FIG. 1, emitting area 12 is shown considerably larger than it would be in an actual device. For example, emitting area 12 typically has a diameter of about 50–100 micrometers (2–4 mils) while spherical lens 14 typically has a diameter of 250 to 380 micrometers (10 to 15 mils). Thus, any lateral misalignment of lens 14 with respect to emitting area 12 causes a considerable decrease in the amount of light gathered by lens 14. In the prior art, adhesive 13 is typically applied to the upper surface of semiconductor device 11 and lens 14 is positioned over emitting area 12. Lens 14 is then held in place until adhesive 13 has cured sufficiently to maintain the alignment of lens 14. Lens 14 is typically aligned with emitting area 12 either visually or by passing a current through the device and monitoring the light output. The former technique is inaccurate while the latter technique is time consuming and costly, and is subject to problems of consistency since the alignment is being done by hand.

Figure 2:
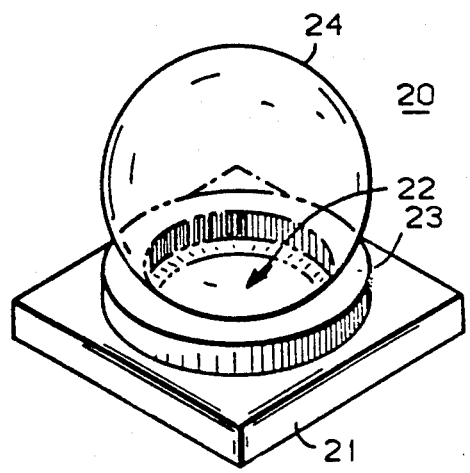
FIG. 2 illustrates a preferred embodiment of an LED with lens in accordance with the present invention.

In accordance with the present invention, as illustrated in FIG. 2, light emitting semiconductor 21 having light emitting area 22 is provided with step 23 surrounding light emitting area 22. Step 23 is formed by depositing layer over the upper surface of semiconductor 21 and then patterning and etching the layer. Since step 23 is formed with light emitting semiconductor 21 using precise optical techniques, the alignment of ring 23 with light emitting area 22 is quite accurate and subject to the same tolerances as for the formation of light emitting area 22. Lens 24 is then readily located by step 23 and is accurately positioned laterally with respect to emitting area 22 as well as being accurately spaced therefrom. Inserting lens 24 into the center portion of step 23 requires little precision and does not require the activation of the LED. Thus, the LED and lens can be assembled in batch form, i.e. requiring the handling of wafers rather than individual die. This further simplifies the assembly of an LED and lens and further decreases the cost of the assembly.

Lens 24 can have any suitable lenticular shape and comprise any transparent, high index of refraction material which will not contaminate the diode. Suitable materials include glass and minerals such as sapphire and GaP. In a preferred embodiment of the present invention, spherical glass beads are used since they are abundantly available at relatively low cost.

Figure 3:
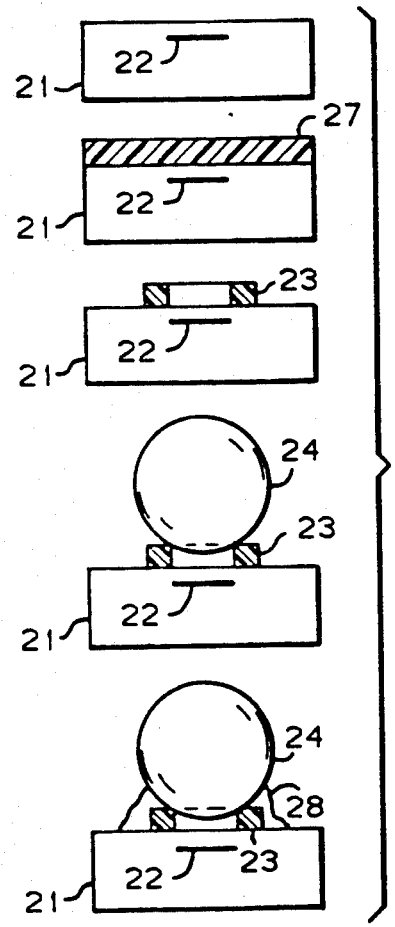
FIG. 3 illustrates a sequence of steps for assembling an LED and lens in accordance with the present invention.

As illustrated in detail in FIG. 3, device 21 with photo-active area 22 is covered by one or more layers 27 which are then patterned and etched to form step 23. Lens 24 is then rested on step 23 and automatically aligned and separated from emitting area 22 by step 23. Finally, a suitable adhesive 28, such as GE-261 or Hysol OS-1600, is disposed about step 23 to secure lens 24 to step 23 and to light emitting semiconductor device 21. The adhesive is then cured by the application of heat.

An additional advantage in the structure of the present invention can be obtained by interchanging the last two process steps. Specifically, uncured adhesive 28 is first applied over and about step 23 and then lens 24 is brought into contact with adhesive 28. Since surface tension forces in adhesive 28 considerably exceed the weight of lens 24, a self-centering action takes place whereby the adhesive positions and holds lens 24 in a central location with respect to step 23. This technique further adapts the present invention to batch handling of devices rather than individual handling of devices. Despite such simplification, however, lens 24 is much more accurately and consistently aligned with emitting area 22 than has been obtainable in the prior art.

Layer 27 may comprise any suitable material, for example, a metal layer, a thick layer of photoresist, or both. If layer 27 is in the form of a ring or other closed figure, it is preferred that thick metal not contact the semiconductor surface due to the large difference in thermal coefficients of expansion between most common metals and the semiconductor. Any thick photoresist material can be used for layer 27. For example, a photo polymer film resist sold under the tradename "RISTON" by E. I. DuPont de Nemours & Co. has been found suitable for use in the present invention. For example, following the manufacturer's directions, a 0.1 mm (four mil) layer of Riston is applied to semiconductor 21 and patterned to form step 23.

Figure 4:
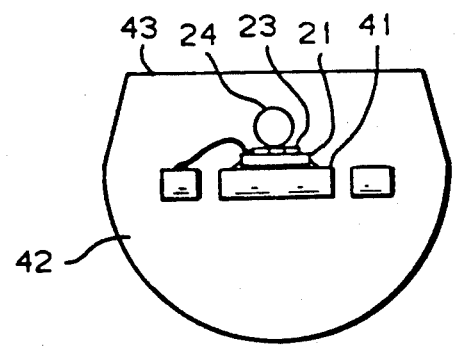
FIG. 4 illustrates a packaged LED in accordance with the present invention.

FIG. 4 illustrates a complete device in what is known as a TO-92 type package. Specifically, header 41 comprises a formed metal blank having appropriate leads adjacent thereto which provides support and electrical and thermal contact to semiconductor die 21. Semiconductor die 21 is attached to header 41 by any suitable means, e.g. soft or hard solder or conductive epoxy. As known in the art, if it is desired to electrically isolate die 21 from header 41, a wafer of electrically insulating ceramic, such as beryllium oxide, can be interposed between the die and header. Step 23 on die 21 locates and separates lens 24 from die 21. Surrounding and enclosing die 21 and lens 24 is encapsulant 42, preferably comprising a colorless polymer, having flat surface 43 which acts as a window.

In operation, current through the LED causes light to be emitted. The light radiating upward is gathered by lens 24 and projected through surface 43. This light is viewed or used directly or can be coupled into an optical fiber transmission line for use at a remote location.

Having thus described the invention it will be apparent to those of skill in the art that various modifications can be made within the spirit and scope of the present invention. For example, one need not completely etch away layer 27 to form step 23 in the shape of an annular ring, but could simply form the central aperture only, leaving the rest of the layer as a protective coating. Further, the alignment and spacing need not be accomplished by use of a closed geometry since, as known in the art, only three supporting points are actually necessary to space and align lens 24. However, particularly for gallium arsenide devices, the crystal structure of the light emitting diode is sensitive to dislocations. Only three supporting points may cause excessive stress in the gallium arsenide. Step 23 in the form of a ring provides a protective function as well in spacing lens 24 away from the surface of semiconductor 21. The LED itself may comprise either planar or "etched well" devices, although planar devices are preferred at present. In present etched well devices, the well tends to be too wide and too deep for the step to be added to the edge of the well. Forming the step in the well would cure this problem. While described in a preferred embodiment as a light emitting device, the present invention can also be embodied in light detecting devices. Also, depending on the adhesive chosen, any suitable cure can be effected, e.g. thermal or actinic radiation.

We claim:

1. A method for assembling a lens and a semiconductor device having a light emitting area comprising the steps of:
    applying a layer of polymeric material to said semiconductor device;
    patterning said layer to form an aperture at least as large as said area and in approximate registration with said area;
    depositing adhesive on said layer;
    contacting said adhesive with said lens whereby surface tension forces cause a self-centering of the lens over said area; and
    causing said adhesive to gel, thereby locking said lens in position over said area.

2. The method as set forth in claim 1, wherein said semiconductor device comprises a wafer with a plurality of light emitting areas formed therein and said patterning step comprises simultaneously forming a plurality of apertures in approximate registration with said areas.

3. The method as set forth in claim 1, wherein said applying step includes the step of controlling the thickness of said layer to control the spacing of said lens from said light emitting area.

* * * * *